(12) United States Patent
Azzopardi et al.

(10) Patent No.: US 9,390,988 B2
(45) Date of Patent: Jul. 12, 2016

(54) METHOD FOR SOLDERING A CAP TO A SUPPORT LAYER

(71) Applicant: STMicroelectronics (Malta) Ltd, Kirkop (MT)

(72) Inventors: Mark A. Azzopardi, Gudja (MT); Kevin Formosa, Zabbar (MT); Ivan Ellul, Zurrieq (MT)

(73) Assignee: STMicroelectronics (Malta) Ltd, Kirkop (MT)

( * ) Notice: Subject to any disclaimer, the term of this patent is extended or adjusted under 35 U.S.C. 154(b) by 468 days.

(21) Appl. No.: 13/630,872

(22) Filed: Sep. 28, 2012

(65) Prior Publication Data

US 2013/0083501 A1     Apr. 4, 2013

(30) Foreign Application Priority Data

Sep. 30, 2011   (IT) .............................. TO2011A0876

(51) Int. Cl.
| | |
|---|---|
| *B32B 1/02* | (2006.01) |
| *B32B 15/01* | (2006.01) |
| *H05K 5/03* | (2006.01) |
| *B23K 1/20* | (2006.01) |
| *H01L 23/10* | (2006.01) |
| *B81C 1/00* | (2006.01) |

(52) U.S. Cl.
CPC ............ *H01L 23/10* (2013.01); *B81C 1/00269* (2013.01); *B81C 2203/019* (2013.01); *H01L 2924/0002* (2013.01); *H01L 2924/16152* (2013.01); *Y10T 428/1241* (2015.01); *Y10T 428/13* (2015.01)

(58) Field of Classification Search
CPC ...................... H01L 2224/131; H01L 2224/97; H01L 2224/03; H01L 2924/014; H01L 2224/96; H01L 2224/81815; H01L 24/03; B81C 1/00269; B81C 1/00261; B81C 1/0023; B81C 2203/0109; B81C 2203/019; B81C 1/00333; B81C 2203/035; B23K 1/0016; B23K 3/0623; H05K 13/0465; H05K 3/303
USPC ............ 361/752, 807; 438/51, 127, 612, 121, 438/124, 106, 15, 456; 257/E21.499, 257/E21.508, E21.509; 29/592.1, 601, 29/623.4, 623.5
See application file for complete search history.

(56) References Cited

U.S. PATENT DOCUMENTS

| | | | | |
|---|---|---|---|---|
| 5,329,160 | A | | 7/1994 | Miura et al. |
| 5,572,065 | A | * | 11/1996 | Burns ........................... 257/666 |
| 5,704,117 | A | * | 1/1998 | Mok et al. ....................... 29/841 |
| 5,763,824 | A | * | 6/1998 | King et al. ..................... 174/374 |

(Continued)

FOREIGN PATENT DOCUMENTS

| | | |
|---|---|---|
| JP | 2008-193581 A | 8/2008 |
| JP | 2009-170782 A | 7/2009 |

*Primary Examiner* — Hung S Bui
*Assistant Examiner* — Michael Matey
(74) *Attorney, Agent, or Firm* — Seed Intellectual Property Law Group PLLC

(57) ABSTRACT

One embodiment discloses a method for soldering a cap for an integrated electronic device to a support layer, including the steps of: providing a support layer; providing a cap including a core of a first material and a coating layer of a second material, the first and second material being respectively wettable and non-wettable with respect to a solder, the coating layer being arranged so as to expose a surface of the core; coupling the cap with the support layer; and soldering the surface of the core to the support layer, by means of the solder.

19 Claims, 5 Drawing Sheets

(56) References Cited

U.S. PATENT DOCUMENTS

| | | | |
|---|---|---|---|
| 6,011,696 A * | 1/2000 | Mahajan et al. | 361/782 |
| 6,489,558 B1 * | 12/2002 | Baba et al. | 174/523 |
| 6,768,654 B2 * | 7/2004 | Arnold et al. | 361/818 |
| 7,129,422 B2 * | 10/2006 | Arnold | 174/377 |
| 7,173,331 B2 * | 2/2007 | Matsubara et al. | 257/704 |
| 7,833,839 B1 * | 11/2010 | Touzelbaev et al. | 438/122 |
| 7,906,845 B1 * | 3/2011 | Galloway et al. | 257/707 |
| 2003/0080411 A1 * | 5/2003 | Baek et al. | 257/704 |
| 2005/0023661 A1 | 2/2005 | Matsubara et al. | |
| 2007/0108634 A1 * | 5/2007 | Higashi et al. | 257/787 |
| 2008/0099907 A1 * | 5/2008 | Oganesian et al. | 257/693 |
| 2008/0283988 A1 * | 11/2008 | Huang et al. | 257/680 |
| 2009/0057884 A1 * | 3/2009 | Too et al. | 257/723 |
| 2009/0301749 A1 * | 12/2009 | Tanaka et al. | 174/50.5 |
| 2010/0200983 A1 * | 8/2010 | Ono et al. | 257/708 |
| 2010/0308475 A1 | 12/2010 | Trautmann et al. | |
| 2010/0327431 A1 * | 12/2010 | Touzelbaev et al. | 257/712 |
| 2011/0219873 A1 * | 9/2011 | Ohta et al. | 73/504.12 |
| 2012/0126347 A1 * | 5/2012 | Yang et al. | 257/416 |

* cited by examiner

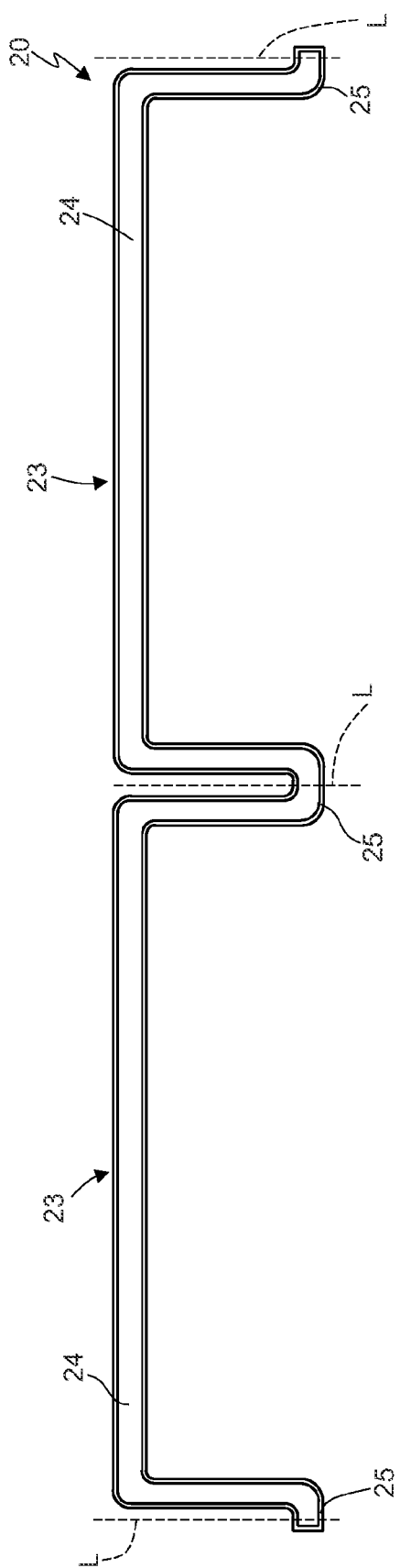
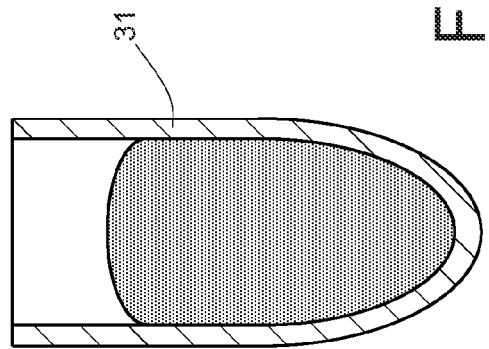
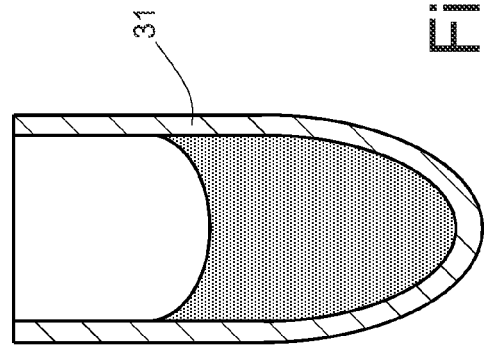

METHOD FOR SOLDERING A CAP TO A SUPPORT LAYER

BACKGROUND

1. Technical Field

The present disclosure relates to a method for soldering a cap to a support layer, and in particular for forming a package for a device manufactured by means of electronic technologies.

2. Description of the Related Art

As is known, in the field of the electronic packaging, caps are soldered to support layers (also known as substrates), so as to form cavities wherein electronic devices are hosted.

As an example, FIG. 1 shows a package 1 formed by a support layer 2 and a cap 3, the package 1 defining a cavity 6; an integrated electronic device 8, as an example formed by a Micro Electro-Mechanical System (MEMS), is located within the cavity 6. In general, in case of a MEMS, the integrated electronic device 8 comprises a first die (not shown), typically known as a sensor die and includes a micromechanical detection structure, and second die (not shown), typically known as an application-specific integrated circuit (ASIC) die and includes a related electronic interface. This first and second die may be stacked and are connected by means of suitable electrical connections in the form of wires designed to electrically connect the sensor die to the ASIC die, and the ASIC die to the support layer 2.

Irrespective of the details of the integrated electronic device 8, the support layer 2 has an internal surface 2a, on which the integrated electronic device 8 rests, and an external surface 2b, which carries suitable electrical connection elements 12 to the outside of the package 1, in the form of "balls" or "bumps" or "lands".

Furthermore, the support layer 2 is usually made of a multi-layer structure, composed of several layers of conductive material separated via dielectric layers; electrical traces (not shown) and vias 10 are provided through the support layer 2, so as to electrically connect the integrated electronic device 8 to the electrical connection elements 12.

The cap 3 comprises a core 4 and a coating layer 5. The core 4 is generally of brass and is entirely coated by the coating layer 5, this latter being usually made up of tin or alloys such as a NiAu alloy. Furthermore, the cap 3 is soldered to the support layer 2 by means of the so-called conventional solder reflow technique. Therefore, the cap 3 is made integral with the support layer 2 by means of a solder joint 16, which defines a sealing ring interposed between the support layer 2 and the cap 3.

The coating layer 5 is made up of a so-called "wettable material", which, upon contacting a solder paste and following a thermal treatment, can form an intermetallic compound with the solder contained in the solder paste.

In practice, the entire surface of the core 4 is covered with a solderable material. Therefore, as shown in FIG. 2, it may happen that, at the end of the soldering process, the solder extends not only in the gap G (FIG. 3) between the support layer 2 and the cap 3, but also along a portion of the inner wall of the cap 3, defined by a corresponding portion of the coating layer 5; in particular, the solder may extend along a vertical portion of the inner wall of the cap 3, orthogonally oriented with respect to the support layer 2.

The volume of solder which extends along the inner wall of the cap 3 is taken away from the gap G between the support layer 2 and the cap 3, thereby leading to the formation of voids V within the solder joint 16, as shown in FIG. 3.

In practice, because of the above mentioned voids V, it may happen that the package 1 is not fully sealed. Similarly, it may happen that the package 1 becomes unsealed on customer site, as an example because of slight mechanical shocks or during soldering of the package on the customer board.

BRIEF SUMMARY

The present disclosure is directed to soldering methods that solve at least in part the problems described above. According to one embodiment of the disclosure, there is provided a soldering method comprising providing a support layer and a cap. The cap includes a core of a first material and a coating layer of a second material. The first and second materials are wettable and non-wettable, respectively, with respect to a solder. The coating layer is located around the core and exposes a surface of the core. The method further includes coupling the cap with the support layer and using the solder, soldering the surface of the core to the support layer.

BRIEF DESCRIPTION OF THE SEVERAL VIEWS OF THE DRAWINGS

For the understanding of the present disclosure, embodiments are now described, purely as non-limitative examples, with reference to the enclosed drawings, wherein:

FIG. 4 shows a cross-section of an array of caps;

FIGS. 5a and 5b show cross-sections of a container;

DETAILED DESCRIPTION

Figure 1:
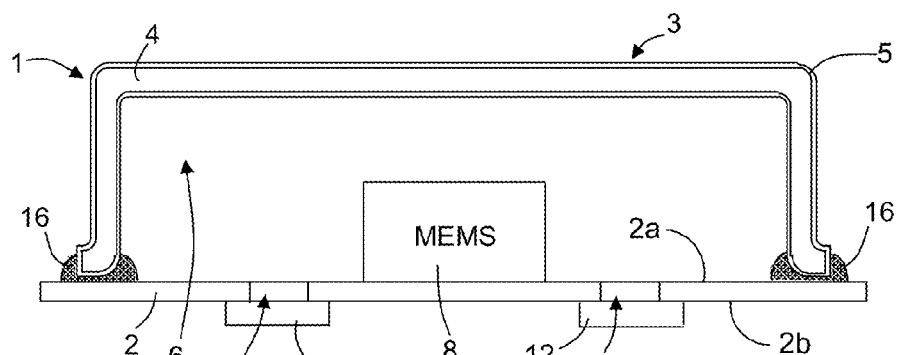
FIGS. 1 and 2 show schematic cross-sections of packages of a known type.
Figure 2:
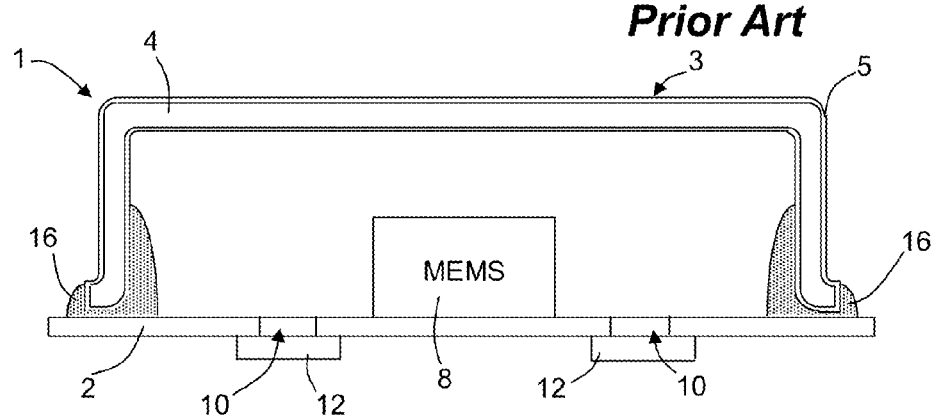
Figure 3:
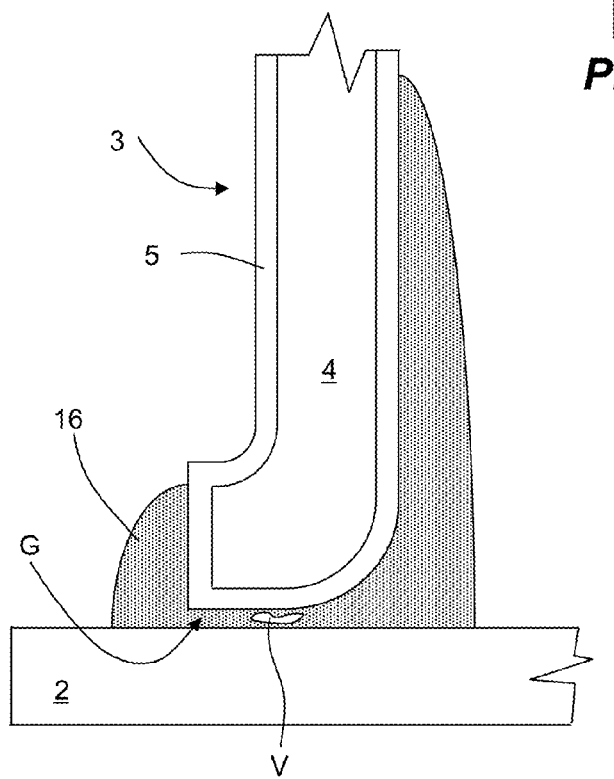
FIG. 3 shows an enlarged view of a portion of the package shown in FIG. 2.

The following description will make reference, purely by way of non-limiting example, to the soldering of a plurality of caps to a support layer, although it is clear that the present method can be applied also in case of soldering of a single cap to the support layer.

According to a first embodiment, an array 20 of caps 23 is provided, as shown in FIG. 4. In particular, the array 20 shown in FIG. 4 comprises two caps 23, connected one to another.

In detail, each of the caps 23 comprises a core 24 of a first material, this core 24 being coated by a coating layer 25 of a second material. In practice, the cores 24 of the caps 23 are joined together, thereby forming an inner layer of the array 20; furthermore, the coating layers 25 of the caps 23 are joined together, thereby forming an outer layer of the array 20, which may entirely coat the inner layer.

The first and the second material are, respectively, wettable and non-wettable with respect to a same solder. To this regard, given a generic material, it is generally said "wettable" with respect to a given solder if, assuming to fill a container 31 of this generic material with this given (liquid) solder, this latter forms a concave meniscus, as shown in FIG. 5a. Conversely, this generic material is generally said "non-wettable" with respect to this given solder if the meniscus is convex, as shown in FIG. 5b. Furthermore, with particular reference to the soldering, the expression "wettable material" refers to a material which, given a solder intended to be used in a following soldering step, can form an intermetallic compound with this given solder; therefore, a wettable material is a material which, upon contacting a solder paste containing this given solder and following a thermal treatment, forms an intermetallic compound with this given solder, thereby forming a solder joint. Hence, from a practical point of view, the expressions "wettable" and "non-wettable" refer to materials which, respectively, can and cannot be soldered by use of this given solder.

That being stated, purely by way of non-limiting example, the solder may be the so-called SAC 305; consequently, the first and the second material may be brass and (organic) polymer, respectively. As a further example, the solder may be an alloy SnSb, in which case the first and second material may respectively be copper and aluminum; still as a further example, the solder may be an alloy SnPb, in which case the first and second material may respectively be nickel and ceramics.

Figure 6:
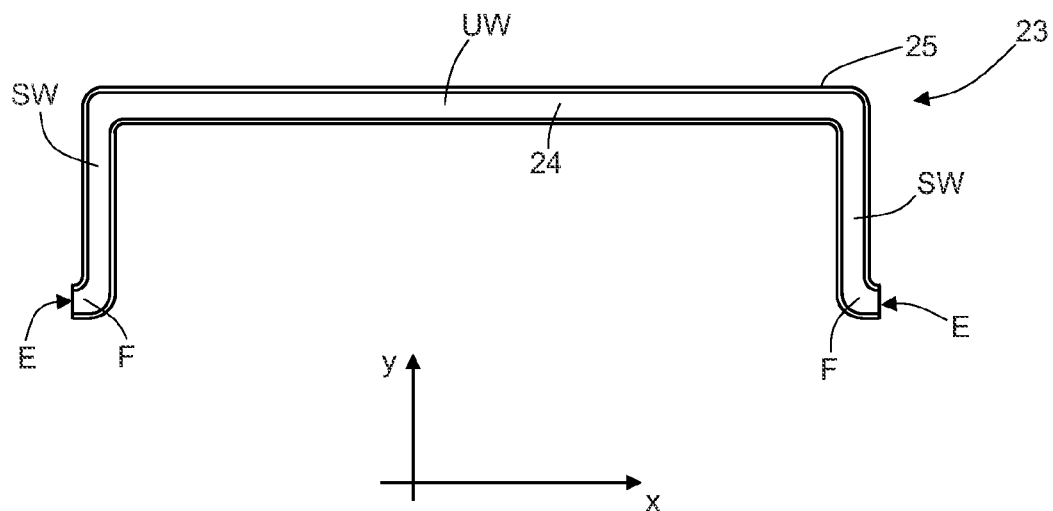
FIGS. 6 and 7 show, respectively, a cross-section and a perspective view with parts taken away of a cap.

Afterwards, the cap array 20 is singulated, as an example by means of a punching step along cut lines L, so as to separate the caps 23 one from another; furthermore, as shown in FIG. 6, the singulation exposes, for each cap 23, a side surface E of the respective core 24, this side surface E not being coated by the coating layer 25.

Figure 7:
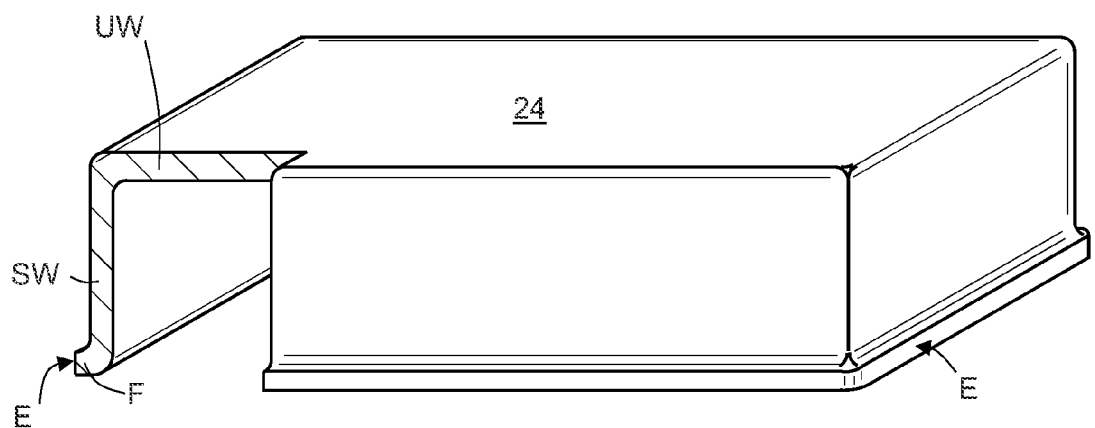

In greater detail, each of caps 23 is such that, in top plan view, it may have, as an example, a squared shape or a rectangular shape or a circular shape. Furthermore, as shown in FIG. 6 and in FIG. 7 (wherein, for the sake of clarity, the coating layer 25 is not shown), each of the cores 24 has an upper wall UW extending parallel to a first direction x, and a side wall SW projecting from the outer profile of the upper wall UW, along a second direction y which is orthogonal to the first direction x. At an end of the side wall SW, each core 24 has a flange F; in particular, the flange F and the upper wall UW are arranged at opposite ends of the side wall SW. Furthermore, the flange F projects at least in part outwardly with respect to the outer profile of the side wall SW. Put in other words, the flange F is parallel to the first direction x and defines, together with the side wall SW, a foot of the core 24; furthermore, the flange F defines the above mentioned side surface E, which is parallel to the second direction y.

Figure 8A:
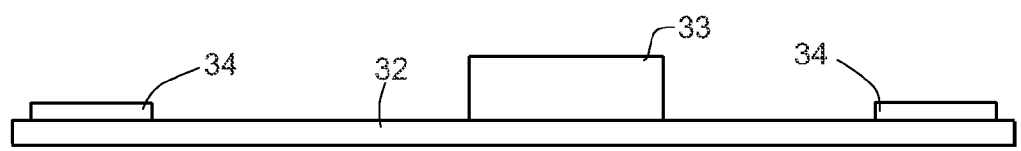
FIGS. 8a and 8b show, respectively, a cross-section and a top-plan view of a support layer during a step of the present method.

Then, a support layer 32 is provided, as shown in FIG. 8a. In particular, the support layer 32 is equipped with a soldering pad 34 for each cap 23 to be soldered on the support layer 32 itself. For the sake of clarity, in FIG. 8a only one soldering pad 34 is shown. In addition, as is shown in FIG. 8a, one or more electrical components 33, such as a MEMS, may be arranged on the support layer 32, in a per se known manner.

Figure 8B:
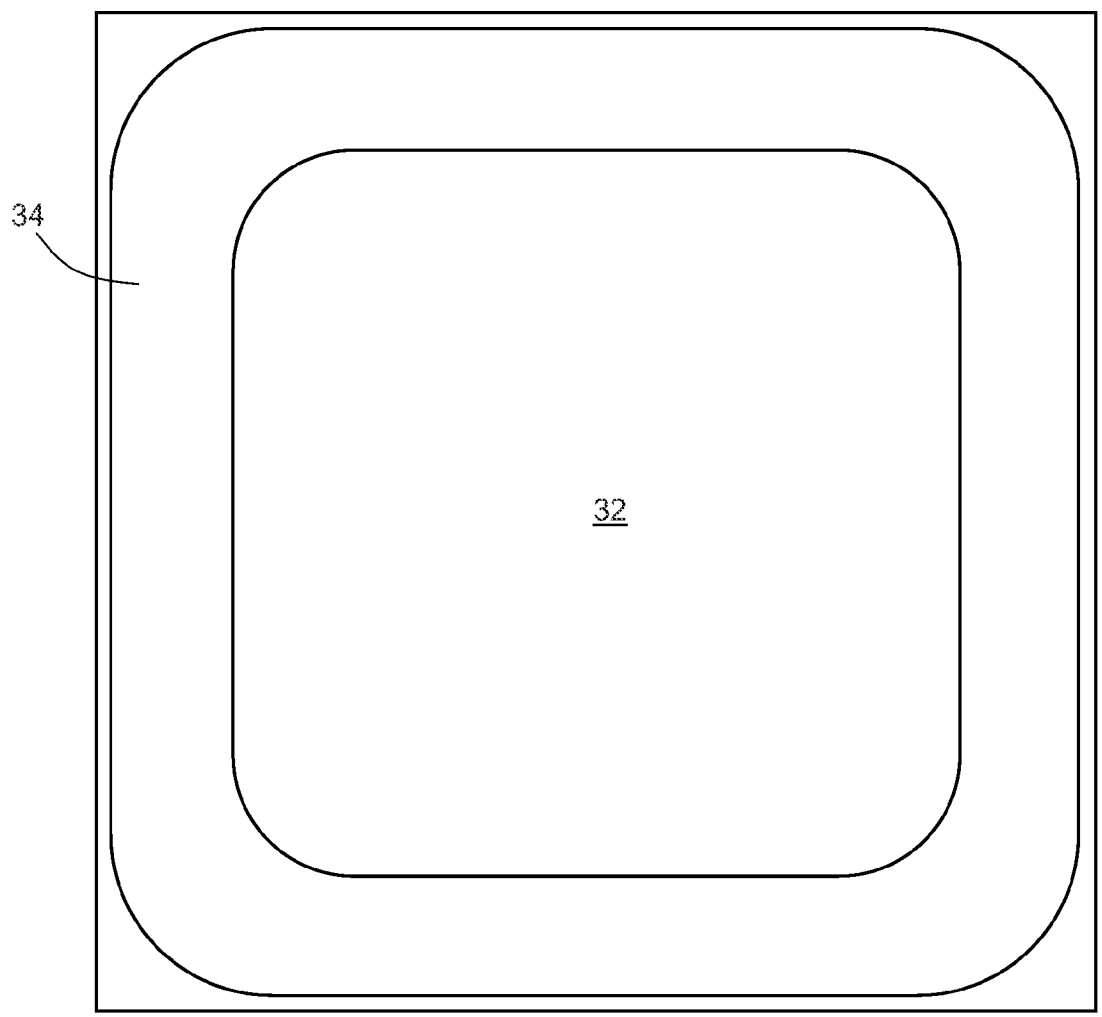

In detail, the support layer 32 may be made up of a multilayer structure, composed of several layers (not shown) of conductive material separated via dielectric layers (not shown); these latter layers may be formed of laminate (a material made of glass fibers and an organic polymer) or ceramic. The soldering pad 34 is formed by a third material, which is wettable and may be the same material as the first material of the core 24; furthermore, as shown in FIG. 8b, the soldering pad 34 has a closed shape, which corresponds to the shape of the flange F of the corresponding cap 23.

Figure 9:
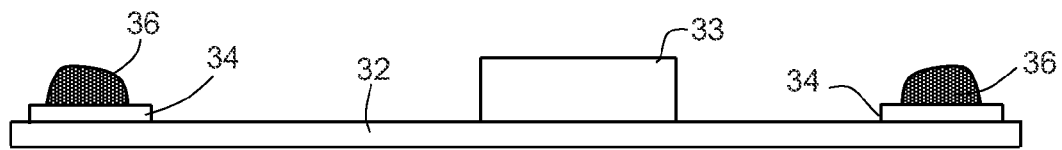
FIG. 9 shows a schematic cross-section of a support layer during a further step of the present method.

As shown in FIG. 9, a solder paste is then applied onto the soldering pad 34, so as to form a solder paste bump 36. The solder paste may be formed by a solder in the form of spheres suspended in a flux. To this regard, both the above mentioned first material and third material are wettable with respect to the solder of the solder paste bump 36; furthermore, the above mentioned second material is non-wettable with respect to the solder of the solder paste bump 36.

Figure 10:
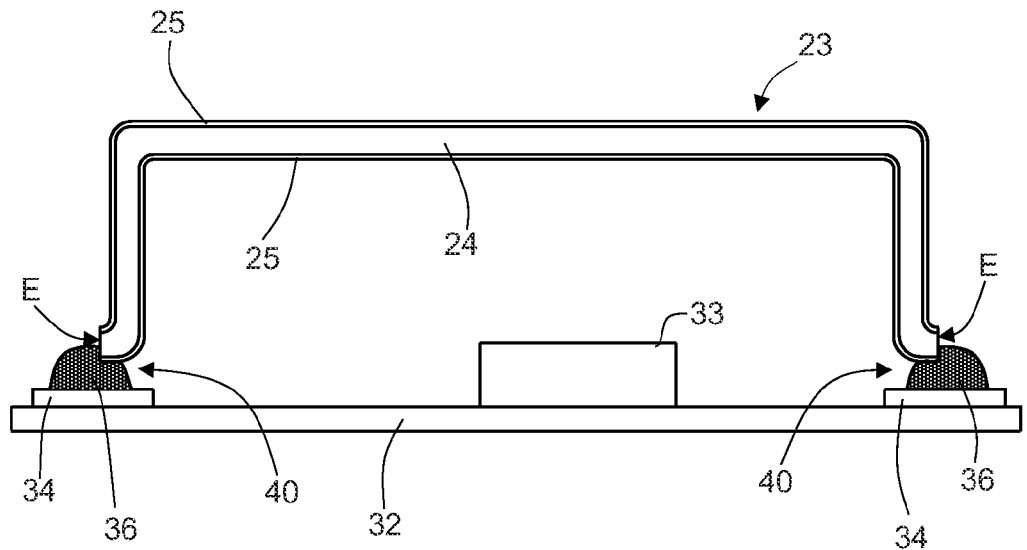
FIGS. 10 and 11 show schematic cross-sections of a support layer and a cap, during different steps of the present method.
Figure 11:
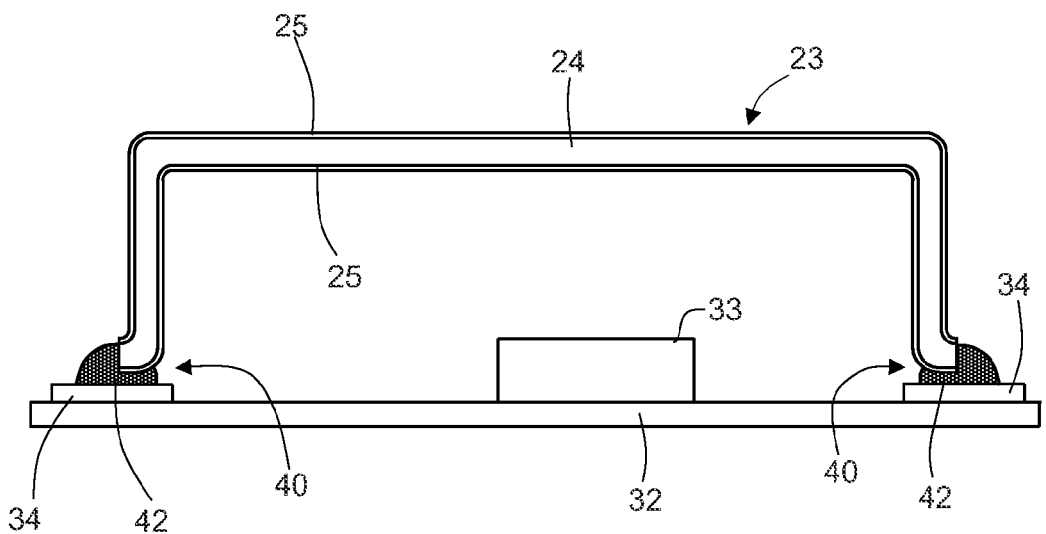

As shown in FIG. 10, each cap 23 is coupled to the support layer 32; in particular, each cap 23 is brought in contact with the corresponding solder paste bump 36. For the sake of clarity, FIG. 10, as well as the following FIG. 11, shows only one cap 23. The coupling may be performed so that the flange F of the cap 23 rests on the solder paste bump 36; in particular, the coupling may be performed so that the solder paste bump 36 fills at least in part a gap 40 defined by the soldering pad 34 and the cap 23, and projects at least in part outwardly with respect to the side surface E, with which it is in direct contact.

Afterwards, as shown in FIG. 11, a thermal treatment is carried out, based on the first, the second and the third material. During this thermal treatment, also known as "reflow", the flux of the solder paste bump 36 cleans a possible contaminating layer (if any) laid on the side surface E; furthermore, the solder spheres melt and form a solder joint 42, interposed between the side surface E and the soldering pad 34. The solder joint 42 renders the cap 23 and the support layer 32 integral one to another.

In detail, the side surface E of the core 24 is the only exposed wettable surface of the cap 23, therefore it is the only surface of the core 24 which can directly contact the solder paste bump 36. All the remaining surfaces of the core 24 are protected by the coating layer 25, which is non-wettable. Thus, during the soldering process, the solder is prevented from flowing along wettable surfaces of the cap 23 other than the side surface E, thereby preventing the formation of voids within the solder joint 42. In fact, because of the presence of the non-wettable coating layer 25, the solder cannot project along the inner surface of the side wall SW.

The advantages of the present soldering method emerge clearly from the foregoing description. In particular, the present method allows to form a sealing ring between a cap and a support layer, this sealing ring being void free. The sealing ring, and hence the package, is more resilient to mechanical shocks and to multiple reflows.

Finally, it is clear that numerous variations and modifications may be made to the soldering method described and illustrated herein, all falling within the scope of the disclosure.

As an example, the above successions of steps are non-limiting, in the sense that the described operations may be carried out in an order different than the described one.

Furthermore, it is also possible to apply the solder paste and form the solder paste bump on a support layer without any electrical component, namely on a support layer provided with the soldering pad(s) only. In this latter case, electrical components are assembled on the support layer after the formation of the solder paste bump. Afterwards, the cap is mechanically coupled with the support layer, and the solder joint is formed as previously described.

Finally, it is possible to envisage additional steps, such as a step of applying a flux onto the cap, as an example before mechanically coupling the cap itself with the support layer. However, the use of flux is not necessary.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method comprising:
coupling a cap to a support layer, the cap including a core of a first material and a coating layer of a second material, the first and second materials being wettable and non-wettable, respectively, with respect to a solder, the coating layer coating a first surface of the core, the first surface of the core being located between the core and the support layer, wherein the core is exposed at a first portion at an outermost external outer perimeter of the cap and forms a portion of an outer surface of the cap; and
using the solder, soldering the exposed first portion of the core to the support layer, the solder also contacting the coating layer that coats the first surface of the core located between the core and the support layer.

2. The method according to claim 1, wherein said core has:
an upper wall extending parallel to a first direction;
a side wall projecting from an outer profile of the upper wall, along a second direction which is transverse to the first direction; and
a flange, said flange and said upper wall being arranged at opposite ends of the side wall, said flange projecting at least in part outwardly with respect to the side wall, and wherein said flange defines said exposed first portion of the core.

3. The method according to claim 2, wherein said second direction is substantially orthogonal to the first direction, and said exposed first portion of the core is substantially parallel to said second direction.

4. The method according to claim 2, wherein said coating layer internally coats the side wall.

5. The method according to claim 1, wherein prior to coupling the cap with the support layer, the method comprises:
forming a soldering pad of a third material on a surface of the support layer, said third material being wettable with respect to said solder; and
applying a solder paste onto said soldering pad, wherein soldering the exposed first portion of the core to the support layer comprises soldering the exposed first portion of the core to the soldering pad.

6. The method according to claim 5, wherein coupling the cap with the support layer is carried out after applying the solder paste onto said soldering pad.

7. The method according to claim 5, wherein said soldering pad has a closed shape.

8. The method according to claim 1, wherein providing the cap comprises:
providing an array of caps, the caps of the array being connected to one another, the cores of the caps forming an inner layer of the array, and the coating layers of the caps forming an outer layer of the array, the outer layer entirely coating the inner layer;
separating the array of caps from each other and exposing, for each cap, the exposed first portion of the core.

9. A cap for coupling to a support layer and covering an electronic device, said cap comprising:
a core of a first material that is wettable with respect to a solder; and
a coating layer of a second material that is non-wettable with respect to the solder, the coating layer coating a first surface of the core, the first surface of the core being located between the core and the support layer, wherein the core is exposed at a first portion at an outward facing, outermost perimeter of the cap and forms a portion of an outer surface of the cap.

10. The cap according to claim 9, wherein the core includes:
an upper wall extending parallel to a first direction;
a side wall projecting from an outer profile of the upper wall, along a second direction which is transverse to the first direction; and
a flange, the flange and the upper wall being arranged at opposite ends of the side wall, the flange projecting at least in part outwardly with respect to the side wall, and wherein the flange defines the exposed first portion of the core.

11. The cap according to claim 10, wherein the second direction is substantially orthogonal to the first direction, and the exposed first portion of the core is substantially parallel to the second direction.

12. The cap according to claim 10, wherein the first material includes at least one of brass, copper, and nickel and the second material includes at least one of polymer, aluminum and ceramic.

13. A package comprising:
a support layer having a first surface;
a cap that includes a core of a first material that is wettable with respect to a solder and a coating layer of a second material that is non-wettable with respect to the solder, the coating layer coating a first surface of the core, the first surface of the core being located between the core and the first surface of the support layer, wherein the core is exposed at a first portion that forms an outermost portion of an outward facing surface of the cap, the exposed first portion of the core of the cap is soldered to the first surface of the support layer by the solder, the solder also contacting the coating layer that coats the first surface of the core located between the core and the support layer, the cap and the support layer forming a cavity; and
an electronic device located on the first surface of the support layer and inside the cavity.

14. The package according to claim 13, wherein the support layer includes a soldering pad of third material on the first surface of the support layer, the third material being wettable with respect to the solder, wherein the exposed first portion of the core of the cap is soldered to the soldering pad of the support layer.

15. The package according to claim 13, wherein the soldering pad has a closed shape.

16. The package according to claim 14, wherein the soldering pad extends around a perimeter of the support layer.

17. The package according to claim 13, wherein the core includes:
an upper wall extending parallel to a first direction;
a side wall projecting from an outer profile of the upper wall, along a second direction which is transverse to the first direction; and
a flange, the flange and the upper wall being arranged at opposite ends of the side wall, the flange projecting at least in part outwardly with respect to the side wall, and wherein the flange defines the exposed first portion of the core.

18. The package according to claim 17, wherein the second direction is substantially orthogonal to the first direction, and the exposed first portion of the core is substantially parallel to the second.

19. The package according to claim 13, wherein the first material includes at least one of brass, copper, and nickel and the second material includes at least one of polymer, aluminum and ceramic.

* * * * *